United States Patent
Okada et al.

(10) Patent No.: US 10,953,440 B2
(45) Date of Patent: Mar. 23, 2021

(54) SOUND-PRESSURE ANALYZER AND A METHOD IN THE HIGH-INTENSITY ACOUSTIC FIELD, AND AN ULTRASONIC CLEANER AND AN ULTRASONIC PROCESSOR

(71) Applicant: HONDA ELECTRONICS CO., LTD., Aichi (JP)

(72) Inventors: Nagaya Okada, Aichi (JP); Yoshiyuki Asakura, Aichi (JP)

(73) Assignee: HONDA ELECTRONICS CO., LTD., Aichi (JP)

( * ) Notice: Subject to any disclaimer, the term of this patent is extended or adjusted under 35 U.S.C. 154(b) by 22 days.

(21) Appl. No.: 16/304,720

(22) PCT Filed: Apr. 19, 2017

(86) PCT No.: PCT/JP2017/015802
§ 371 (c)(1),
(2) Date: Nov. 27, 2018

(87) PCT Pub. No.: WO2018/193569
PCT Pub. Date: Oct. 25, 2018

(65) Prior Publication Data
US 2020/0298288 A1   Sep. 24, 2020

(51) Int. Cl.
*B08B 3/12*       (2006.01)
*G01H 3/08*       (2006.01)
*H01L 21/304*     (2006.01)

(52) U.S. Cl.
CPC ........... *B08B 3/12* (2013.01); *G01H 3/08* (2013.01); *H01L 21/304* (2013.01)

(58) Field of Classification Search
CPC ...................................................... B08B 3/12
See application file for complete search history.

(56) References Cited

U.S. PATENT DOCUMENTS

2011/0176155 A1   8/2011   Puskas et al.

FOREIGN PATENT DOCUMENTS

| JP | 06-300725   | 10/1994 |
| JP | 2007-165695 | 6/2007  |
| JP | 2014-076440 | 5/2014  |

OTHER PUBLICATIONS

Kenji Yasuda et al., "Frequency dependence of ... by ultrasonic irradiation", the 24th Sonochemistry Panel Discussion: Compilation of lectures, Oct. 23, 2015, pp. 11-12.

*Primary Examiner* — Jason Y Ko
(74) *Attorney, Agent, or Firm* — Clark & Brody LP

(57) ABSTRACT

A sound-pressure analyzer in a high-intensity acoustic field that can accurately presume the cavitation-threshold and cavitation-amount being generated comprises: a hydrophone for transferring a voltage-signal corresponding to said sound-pressure in said acoustic field; a frequency-analyzer; and an arithmetic device. The frequency-analyzer analyzes the frequency-component in such an acoustic field based on the voltage-signal being transferred from the hydrophone and then sorts such signal into a basic-frequency component, a harmonic component, a sub-harmonic component and a white-noise component. An arithmetic device conducts arithmetic operations to evaluate the average of broadband sound pressure (ABP) of the white-noise component within a frequency-range having practical sensitivity, thus presuming the presence of the cavitation-threshold and the cavitation-amount being generated at a point wherein the ABP increases from about zero and wherein such cavitation-amount being generated is according to the level of the ABP value.

17 Claims, 6 Drawing Sheets

SOUND-PRESSURE ANALYZER AND A METHOD IN THE HIGH-INTENSITY ACOUSTIC FIELD, AND AN ULTRASONIC CLEANER AND AN ULTRASONIC PROCESSOR

TECHNICAL FIELD

This invention relates to a sound-pressure analyzer and to the method of its use in a high-intensity acoustic field and relates to an ultrasonic cleaner and an ultrasonic processor.

TECHNICAL BACKGROUND

As a piece of equipment, using ultrasonic waves, for example, an ultrasonic cleaner is conventionally well known. Generally, an ultrasonic cleaner has a structure of which an ultrasonic transducer is provided at the bottom part of a processing tank that reserves a cleaning liquid. When such an ultrasonic transducer irradiates ultrasonic waves into the cleaning liquid, an acoustic field is formed in such cleaning liquid causing the cleaning of a cleaning target. It is known that such ultrasonic waves generated by such an ultrasonic transducer are reflected onto the water surface so as to generate a standing wave. Also, it is known that if a strong ultrasonic wave within a specified frequency is irradiated into such a cleaning liquid, a high-intensity acoustic field is formed and depressurization and pressurization occur alternatively, thus making air bubbles under such depressurization in such cleaning liquid, which is called "cavitation."

Cavitation is likely to occur insomuch by a low-frequency ultrasonic wave, and a comparatively low level of ultrasonic energy can make cavitation occur. Thus, an ultrasonic cleaner of a low-to-medium frequency can efficiently clean a comparatively large area of dirt and of tough-greasy dirt by positively using the impact-waves that occur by the expansion of and by the contraction of and by the destruction of cavitation. Also, such an ultrasonic cleaner, for cleaning semiconductor substrates or the like, undergoes the cleaning process by using comparatively high-frequency ultrasonic waves (hundreds of kHz to some MHz) and by controlling the force of impact caused by the destruction of cavitation (see e.g. Patent Document 1). Such an ultrasonic cleaner, to maintain cleaning efficiency, needs a certain kind of technology to control the occurrence of cavitation.

It is also known that if a hydrophone, that is, a sensor for detecting e.g. sound pressure, is inserted into the cleaning liquid of the ultrasonic cleaner, that voltage, corresponding to the sound pressure of the acoustic field, is outputted. At this time, not only the frequency component f of the fundamental wave is generated by the oscillator but a high-frequency component (harmonic component) and a sub-harmonic frequency component and a broadband white-noise frequency component are generated. A non-linear sound derived from cavitation is outputted especially near the condition-value whereat cavitation starts. Therefore, regarding the prior art, as described in e.g. Patent Document 2, it is suggested to verify if cavitation occurs or not by monitoring the occurrence of a non-linear component such as a harmonic component or a sub-harmonic component or the like.

PRIOR ARTS

Patent Document

Patent Document 1:
Japanese Published Unexamined Patent Application Number: 2007-165695
Japanese Published Unexamined Patent Application Number: 2014-76440

DISCLOSURE OF THE INVENTION

Problems to be Resolved by the Invention

The method of the Patent Document 2 makes it possible to verify cavitation only if such cavitation has already occurred. However, it is difficult to presume accurately the threshold at which cavitation starts (cavitation threshold) and the amount of such cavitation being generated.

It is empirically known that a cavitation-derived non-linear sound is produced near the condition-value whereat cavitation starts; while, on the other hand, the sound pressure of the basic-frequency component drops once and then hikes again, later. Thus, it is thought that the cavitation threshold can be perceived by such a drop in sound pressure. However, such a drop is unstably influenced by conditions at the time. Thus, determining such a drop is inappropriate for an accurate presumption of the cavitation threshold.

It is conventionally suggested that the incidence of cavitation is perceived by focusing on and monitoring the white-noise component. Specifically, in the graph showing the frequency and the output-voltage (sound pressure) as the horizontal axis and vertical axis, respectively, with the curve showing the frequency-component of the hydrophone-output, that the white-noise component, as shown in the shaded area, is integrated to evaluate the BIV value (i.e. broadband Integrated Voltage Value). See the following formula. Formula 1 incidence $$BIV = \int_a^b v(f) df$$

As shown in the above formula, a and b show the integral-range (frequency), while v(f) shows the output-voltage of the hydrophone. However, when integrating, calculation should be done by reducing the basic-frequency component, the harmonic component and the sub-harmonic component.

It is known that there is not always a linear relationship between the electric power that is being loaded into the ultrasonic transducer and the BIV value. Therefore, it was difficult to presume accurately the cavitation threshold and the amount of cavitation being generated.

Under the circumstances mentioned above, a method for evaluating accurately the sound pressure was desired even in an environment whereat high frequency is generated by the presence of a high-intensity acoustic field.

This invention was achieved in light of the above problems and aims to provide a sound-pressure analyzer and a method in the high-intensity acoustic field to presume accurately the cavitation threshold and the amount of cavitation being generated. This invention further aims to provide an ultrasonic cleaner and an ultrasonic processor that readily and accurately allows the setting of the appropriate ultrasonic-processing condition based on an accurate presumption of the cavitation threshold and of the amount of cavitation being generated.

Means of Solving the Problems

The inventors of this invention strived in their research to solve the above problems. They focused on the white-noise component of the non-linear component and then introduced the average of broadband sound pressure (ABP) of the white-noise component within the ultrasonic range wherein the hydrophone has practical sensitivity, thus they learned that it is possible to presume accurately the cavitation threshold and the amount of cavitation being generated compared to just applying the BIV value. The inventors proceeded with further research based on the above perception, thus achieving finally the invention as described below. Hereinafter, the invention for solving the above problems is detailed.

The first aspect of this invention refers to a sound-pressure analyzer in the high-intensity acoustic field, comprising: a hydrophone for detecting an ultrasonic acoustic field in a liquid and for outputting a voltage signal corresponding to such an acoustic field; a frequency analyzer for analyzing the frequency component of such an acoustic field based on the voltage signal being outputted from said hydrophone and for sorting such a frequency component into a basic-frequency component, a harmonic component, a sub-harmonic component and a white-noise component; and an arithmetic device for performing specific arithmetic operations based on an analysis of the frequency component obtained by the frequency analyzer, characterized in that the arithmetic device evaluates the average of broadband sound pressure (ABP) of the white-noise component within a frequency range of practical sensitivity by performing arithmetic operations and by presuming that there is a threshold whereat cavitation starts at a point whereat the average of broadband sound pressure (ABP) of the white-noise component increases from about zero, and that the amount of cavitation being generated is presumed according to the level of the average of broadband sound pressure (ABP) of the white-noise component.

The effects of the above first aspect of this invention are described hereinafter. In increasing the electric power that is being loaded into the ultrasonic transducer, the initial ABP value stays at about zero. However, it is clear that the ABP value will increase at a certain point, and that the almost-linear relationship of the electric power being applied to the ultrasonic transducer is maintained. As such, finding the point whereat the ABP value increases from about zero makes it possible to presume accurately the cavitation threshold compared to using other methods. Also, it is possible, by the level of the ABP value, to presume accurately the amount of cavitation being generated.

The second aspect of this invention refers to a sound-pressure analyzer in the high-intensity acoustic field according to the first aspect of this invention, characterized in that the arithmetic device connects the valleys among the plurally adjoining frequency peaks in a line, concerning the sound pressure within a frequency range having practical sensitivity, so as to remove the upper area other than the line, thus extracting the white-noise component.

Thus, the second aspect of this invention allows for the arithmetic device to perform specific arithmetic operations, so as to remove the basic ultrasonic component that emerges with a higher sound pressure than the white-noise component, the harmonic component and the sub-harmonic component. As such, it is possible to extract accurately the white noise, thus eventually making it possible to presume readily and accurately the cavitation threshold and the amount of cavitation being generated.

The third aspect of this invention refers to a sound-pressure analyzer in the high-intensity acoustic field according to the first or second aspect of this invention, characterized in that the arithmetic device by the arithmetic operation evaluates the average of sound pressure (AP) of all the frequency components within a frequency range having practical sensitivity, thus presuming the correct sound-pressure value based on the average of sound pressure (AP) of all the frequency components.

Thus, the third aspect of this invention allows for presuming the correct sound-pressure value based on the AP value.

The forth aspect of this invention refers to a sound-pressure analyzer in the high-intensity acoustic field according to any one of the first to third aspects of this invention, characterized in that the threshold whereat metallic erosion starts by ultrasonically mechanical effect is evaluated based on the average of broadband sound pressure (ABP) of the white-noise component.

We inventors had already learned that the cavitation threshold is almost the same as the threshold whereat metallic erosion starts by ultrasonically mechanical effect within a low-to-mid-frequency range. However, the inventors learned further that the metallic-erosion threshold is greater than the cavitation threshold within a high-frequency range, e.g. of 100 kHz or more. Thus, we learned that the value that is greater than the ABP value as the standard value is presumably the metallic-erosion threshold within such a high-frequency range. Therefore, the fourth aspect of this invention allows for presuming accurately the metallic-erosion-threshold value within a low-to-mid-frequency range, thus making it possible to presume the metallic-erosion-threshold value to a certain degree of accuracy within a high-frequency range.

The fifth aspect of this invention refers to a sound-pressure analyzer in the high-intensity acoustic field according to any one of the first to fourth aspects of this invention, characterized in that the hydrophone converts the voltage signal into sound pressure according to the hydrophone-sensitivity characteristic curve, and then such sound pressure is outputted.

The fifth aspect of this invention allows for performing an analysis of the frequency components in the acoustic field and for performing specific arithmetic operations based on the voltage signal after such voltage signal is converted into sound pressure, so as to evaluate accurately the ABP value or AP value, thus making it possible to presume more accurately the cavitation threshold and the amount of cavitation being generated.

The sixth aspect of this invention refers to a sound-pressure analyzer in the high-intensity acoustic field according to any one of the first to fifth aspects of this invention, characterized in that the hydrophone has practical sensitivity as well as a sensitivity that is defined as being more than twice the sensitivity of the S/N ratio (signal-to-noise ratio), and also that such sensitivity is of a frequency exceeding 5 MHz.

If practical sensitivity is defined as sensitivity being more than twice the sensitivity of the S/N ratio, then it is known that the conventional hydrophone has such practical sensitivity within a comparatively narrow frequency range, generally around 100 kHz to 1 MHz. Hence, the sixth aspect of this invention, using the voltage signal being outputted by the hydrophone having practical sensitivity within the frequency range of between 100 kHz and 1 MHz and even higher, allows for evaluating more correctly the ABP value and the AP value. Therefore, it is possible to presume more correctly the cavitation threshold and the amount of cavitation being generated.

The seventh aspect of this invention refers to a sound-pressure analyzer in the high-intensity acoustic field according to any one of the first to sixth aspects of this invention, characterized in that the hydrophone has practical sensitivity defined as sensitivity being more than twice the sensitivity of the S/N ratio and ranging from 20 kHz or more and to 20 MHz or less.

Thus, the seventh aspect of this invention, using the voltage signal being outputted by the hydrophone having practical sensitivity, with such voltage signal ranging widely from a low to a high frequency, allows for evaluating more correctly the ABP value and the AP value. Therefore, it is possible to presume extremely accurately the cavitation threshold and the amount of cavitation being generated.

The eighth aspect of this invention refers to a sound-pressure analyzer in the high-intensity acoustic field according to any one of the first to seventh aspects of this invention, characterized in that the hydrophone is of a structure of which the front side of a piezoelectric body is joined to the inner side of an anti-erosion metal case and of which an acoustic-backing material is aligned on the back side of such a piezoelectric body.

The eighth aspect of this invention is of a structure of which the front side of the piezoelectric body is joined to the inner side of the anti-erosion metal case to prevent such piezoelectric body from being exposed directly to the outside, thus protecting the piezoelectric body from strong vibration or impact. Also, such a sound-pressure analyzer in the high-intensity acoustic field is of another structure of which an acoustic-backing material is aligned on the back side of the piezoelectric body, which makes it possible to design the frequency-sensitivity characteristic to be acoustically flat, so as to have practical sensitivity within a wide frequency range. Therefore, it is possible that the hydrophone be heavy-duty and highly sensitive, though it is small in size. Using such a hydrophone makes it easier to achieve a small-sized, low-priced, durable and high-precision sound-pressure analyzer.

The ninth aspect of this invention refers to a sound-pressure analyzer in the high-intensity acoustic field according to any one of the first to eighth aspects of this invention, characterized in that the sound-pressure analyzer is an ultrasonic-cavitation meter.

The 10th aspect of this invention refers to an ultrasonic cleaner for cleaning a cleaning target being soaked in a liquid by using ultrasonic waves, according to any one of the first to eighth aspects of this invention, characterized in comprising: a processing tank for preserving such a liquid; an ultrasonic transducer, provided on the processing tank, for irradiating such ultrasonic waves into the liquid within the processing tank; a drive unit for controlling the drive of such an ultrasonic transducer; and a sound-pressure analyzer in the high-intensity acoustic field according to any one of the first to eighth aspects of this invention.

The 10th aspect of this invention allows for accurately presuming the cavitation threshold and the amount of cavitation being generated, thus making it possible to set readily and surely the ultrasonic processing conditions appropriate for the ultrasonic cleaning.

The 11th aspect of this invention refers to an ultrasonic cleaner according to the tenth aspect of this invention, characterized in that the drive unit, based on analysis by the sound-pressure analyzer, controls the drive of the ultrasonic transducer on the sound-pressure condition that does not exceed the threshold whereat ultrasonically chemical effect starts with the generation of cavitation.

The 11th aspect of this invention allows for controlling the drive of the ultrasonic transducer on the sound-pressure condition that does not exceed the threshold whereat ultrasonically chemical effect starts with the generation of cavitation, thus making it possible to clean the target by setting the condition just before such chemical effect starts. As such, the cleaning ability is improved more than necessary, thus preventing any chemical damage being done to the surface of the cleaning target.

The 12th aspect of this invention refers to an ultrasonic cleaner, according to the 10th aspect of this invention, characterized in that the drive unit, based on analysis by the sound-pressure analyzer, selects either a sound-pressure condition that does not exceed the threshold whereat ultrasonically chemical effect starts with the generation of cavitation or a sound-pressure condition between the threshold whereat ultrasonically chemical effect starts and the threshold whereat metallic erosion starts with the ultrasonically mechanical effect, thus controlling the drive of the ultrasonic transducer.

The 12th aspect of this invention allows for selecting the comparatively weaker sound-pressure condition or comparatively stronger sound-pressure condition, thus making it possible to clean appropriately the cleaning target according to its property or the like.

The 13th aspect of this invention refers to an ultrasonic processor for chemically processing the cleaning target being soaked in a liquid by using ultrasonic waves, characterized in comprising: a processing tank for reserving such liquid; an ultrasonic transducer provided within such processing tank for irradiating such ultrasonic waves into said liquid within said processing tank; a drive unit for controlling the drive of the ultrasonic transducer; and a sound-pressure analyzer in the high-intensity acoustic field according to any one of the first to eighth aspects of this invention.

The 13th aspect of this invention allows for accurately presuming the cavitation threshold and the amount of cavitation being generated, thus making it possible to set readily and surely the ultrasonic processing conditions appropriate for the ultrasonic cleaning.

The 14th aspect of this invention refers to an ultrasonic processor, according to the 10th aspect of this invention, characterized in that the drive unit, based on analysis by the sound-pressure analyzer, controls the drive of the ultrasonic transducer under a sound-pressure condition that does not exceed the threshold whereat ultrasonically chemical effect starts with the generation of cavitation.

The 14th aspect of this invention allows for controlling the drive of the ultrasonic transducer under a sound-pressure condition that does not exceed the threshold whereat ultrasonically chemical effect starts with the generation of cavitation, thus making it possible to clean the target by setting the condition just before such chemical effect starts. As such, the processing ability is improved more than necessary, thus preventing reduced efficiency of the ultrasonically chemical effect.

The 15th aspect of this invention refers to a method for analyzing the sound pressure in a high-intensity acoustic field, which method comprises: an acoustic field-detecting step for detecting an ultrasonic-acoustic field in a liquid by using a hydrophone that outputs a voltage signal corresponding to the sound pressure in such an acoustic field; a frequency-analyzing step for analyzing the frequency component in such a acoustic field based on a voltage signal being outputted by such a hydrophone and then sorting such frequency component into a basic-frequency component, a harmonic component, a sub-harmonic component and a white-noise component; and an arithmetic step for performing specific arithmetic operations based on analysis of the frequency obtained by the frequency analyzer, characterized in that the arithmetic step performs such arithmetic operations for evaluating the average of broadband sound pressure (ABP) of the white-noise component within a frequency range having practical sensitivity, presuming that there is a threshold of cavitation being generated at the point whereat the average of broadband sound pressure (ABP) of the white-noise component increases from about zero, and presuming that the amount of cavitation being generated is at the level of the average of broadband sound pressure (ABP) of the white-noise component.

The 15th aspect of this invention allows for identifying the point whereat the ABP value increases from about zero, thus making it possible to presume accurately the threshold of cavitation compared to using other methods. Also, it is possible, by the level of the ABP value, to presume accurately the amount of cavitation being generated.

The 16th aspect of this invention refers to a method for analyzing the sound pressure in the high-intensity acoustic field according to the 15th aspect of this invention, characterized in that the arithmetic step performs arithmetic operations to evaluate the average of sound pressure (AP) of the entire frequency component within the range of frequency having practical sensitivity, thus presuming accurately the sound-pressure value based on the average of sound pressure (AP) of the entire frequency component.

The 16th aspect of this invention allows for accurately presuming the sound-pressure value based on the average of sound pressure (AP) of the entire frequency component.

The 17th aspect of this invention refers to a method for analyzing the sound pressure in the high-intensity acoustic field according to the 15th or 16th aspect of this invention, characterized in that the threshold whereat metallic erosion starts by ultrasonically mechanical effect is presumed by the arithmetic step based on the average of broadband sound pressure (ABP) of the white-noise component.

The 17th aspect of this invention allows for accurately presuming the metallic-erosion threshold within the low-to-mid-frequency range by introducing the ABP value, thus making it possible as well to presume the metallic-erosion threshold to a certain degree of accuracy within the high frequency range.

Effects of the Invention

As described above, the first to ninth aspects of this invention make it possible to provide a sound-pressure analyzer in the high-intensity acoustic field that can accurately presume the cavitation threshold and the amount of cavitation being generated. Also, the 10th to 14th aspects of this invention make it possible to provide an ultrasonic cleaner and an ultrasonic processor to set readily and surely the appropriate ultrasonic processing conditions based on an accurate presumption of the cavitation threshold and the amount of cavitation being generated. Furthermore, the 15th to 17th aspects of this invention make it possible to provide a sound-pressure analyzing method in the high-intensity acoustic field to presume accurately the cavitation threshold and the amount of cavitation being generated.

MODE FOR CARRYING OUT THE INVENTION

Hereinafter, the sound-pressure analyzer and the method of its operation in the high-intensity acoustic field as an embodiment of the ultrasonic cleaner are described in reference to the drawings.

Figure 1:
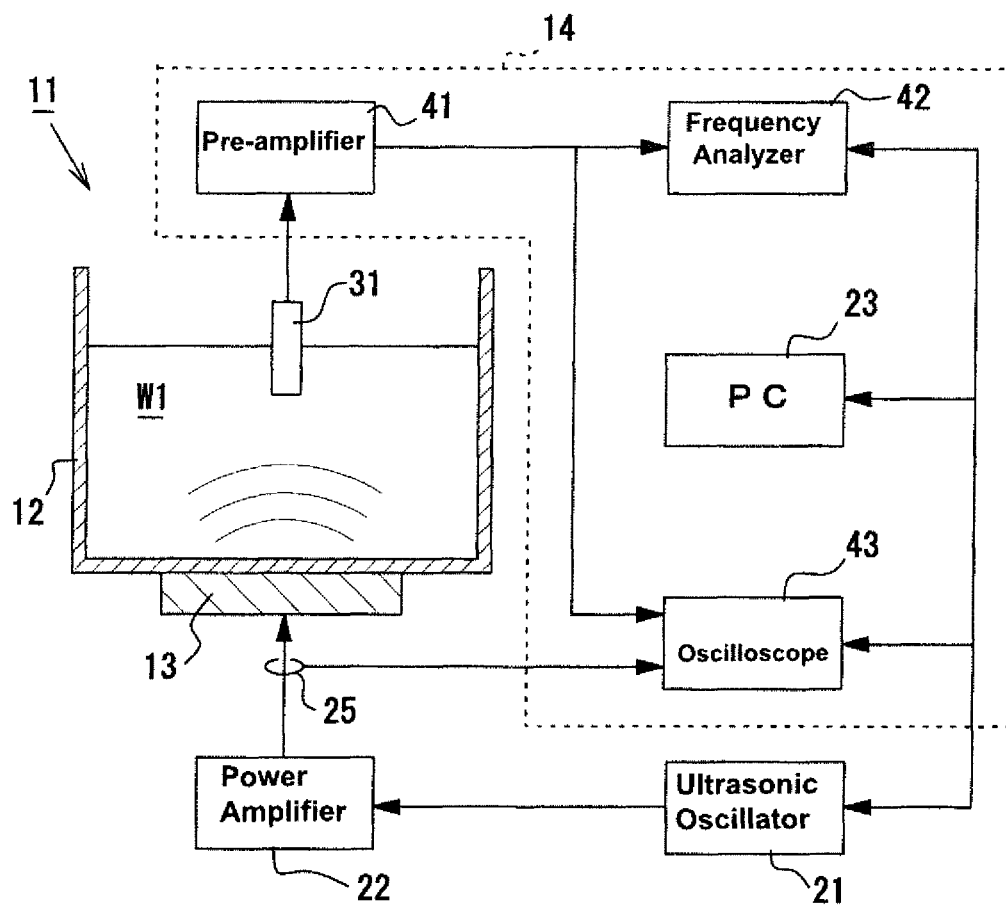
FIG. 1 is the skeleton framework of the ultrasonic cleaner as an embodiment of this invention.

FIG. 1 shows the skeleton framework of the ultrasonic cleaner 11 as the embodiment of this invention. The ultrasonic cleaner 11 is a device for cleaning the cleaning target being soaked in the liquid (e.g. cleaning liquid) W1 by using ultrasonic waves, and comprises the processing tank 12, the ultrasonic transducer 13, the drive unit and the frequency analyzer 42 in the high-intensity acoustic field.

The processing tank 12 is a container consisting of an open-upper part and a closed-bottom part, of such that inside is reserved the liquid W1. Of this embodiment, the cylindrical-duplex tank 12 of 56 mm in diameter is used as the processing tank 12 of which therein the liquid W1 of (air-saturated) water at 25 degrees Celsius is reserved and circulated.

The ultrasonic transducer 13, provided at the outside bottom of the processing tank 12, is the means for irradiating ultrasonic waves into the liquid W1 within the processing tank 12. Of this embodiment, a transducer made of a vibrating diaphragm as the ultrasonic transducer 13 is provided on the outside-bottom surface of the processing tank 12. As the ultrasonic transducer 13, for example, a multi-frequency (22 kHz, 43 kHz and 98 kHz) transducer (Honda Electronics Co., Ltd.) of 45 mm in diameter is used. Other transducers that generate 300 kHz, 490 kHz, 1 MHz or 2 Mhz and are 50 mm in diameter or another transducer (Honda Electronics Co., Ltd. for each product) that generates 5 MHz and is 20 mm in diameter can be used. It is possible also to provide such ultrasonic transducer 13 on the inside-bottom surface of the processing tank 12.

The drive unit of the ultrasonic cleaner 11 comprises an ultrasonic oscillator 21, a power amplifier 22 and a PC (personal computer) 23 as the controlling means. The ultrasonic oscillator 21 is electrically connected to the ultrasonic transducer 13 by the power amplifier 22. The ultrasonic oscillator 21 generates a continuous sine-wave signal at a specified frequency (for this embodiment, 300 kHz and 490 kHz). Such signal is then amplified by the power amplifier 22 and then supplied to the ultrasonic transducer 13, thus driving the ultrasonic transducer 13. Although omitted in the drawing, to drive the ultrasonic transducer 13 at a frequency except 300 kHz and 490 kHz, an impedance-matching circuit is provided between the power amplifier 22 and the ultrasonic transducer 13. The ultrasonic transducer 13 irradiates ultrasonic waves at a frequency corresponding to the frequency being generated by the ultrasonic oscillator 21 (or at the frequency of the impedance-matching circuit). As a result, ultrasonic waves are irradiated upwardly from the bottom of the processing tank 12 into the liquid W1 within the processing tank 12. The PC 23, electrically connected to the ultrasonic oscillator 21, controls the signal-level being generated by the ultrasonic oscillator 21, so as to adjust and to drive the output of said ultrasonic waves being generated by said ultrasonic transducer 13.

The sound-pressure analyzer 14 of the ultrasonic cleaner 11 consists of the hydrophone 31, the pre-amplifier 41, the frequency analyzer 42, the oscilloscope 43 and the PC 23 as the arithmetic device.

Figure 2:
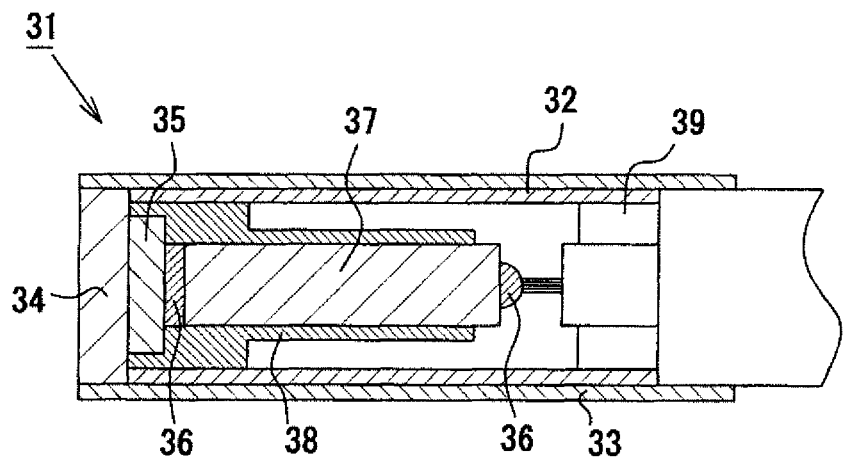
FIG. 2 is the skeleton framework of the hydrophone, as an embodiment of this invention, to be used as the ultrasonic cleaner.

As shown in FIGS. 1 and 2, the hydrophone 31 is an ultrasonic sensor for detecting the acoustic field of the ultrasonic waves in the liquid W1 and for outputting the voltage signal corresponding to the sound pressure of said acoustic field. The tip of the hydrophone 31, being soaked in the liquid W1, is affixed to a supporting member (not shown in the drawing). In this embodiment, a small-sized hydrophone 31 of a diameter of 3.5 mm is used. The anti-erosion metal case 32 of the hydrophone 31 consists of a cylindrical-duplex case 33 and a lid 34 to close the opposite opening of the case 33. The inner-cylindrical part and the lid 34 of the case 33 is made of an anti-erosion metal material such as titanium or the like that can resist the impact of the waves of cavitation. The front side of the piezoelectric body 35 is connected to the inner side of the lid 34. In this embodiment, the sensor material, i.e. a film of PZT (piezoelectric zirconate titanate) is formed on the inner side of the titanium lid 34 by a chemical-synthetic procedure so as to make the piezoelectric body 35 not easily able to be stripped off even by ultrasonic waves. The acoustic-backing material 37 is connected to the rear side of the piezoelectric body 35 by the electricity-conducting adhesive 36. The acoustic-backing material 37 is formed of electricity-conducting metallic material, and the insulating material 38 is provided on the outer periphery of the acoustic-backing material 37 to insulate it from the anti-erosion metal case 32. The base end of the acoustic-backing material 37 is connected to the conductor of the coaxial cable 39 by the electricity-conducting adhesive 36. Also, the coaxial cable 39 is pulled out from the base end of the case 33.

The hydrophone 31 is electrically connected to the frequency analyzer 42 and the oscilloscope 43 by the pre-amplifier 41. The hydrophone 31 outputs the voltage signal corresponding to the sound pressure in the acoustic field to the pre-amplifier 41. After having impedance-converted such voltage signal, the pre-amplifier 41 outputs such voltage signal outside. The oscilloscope 43 then reads the voltage signal being generated by the pre-amplifier 41 and displays the voltage-signal waveform on the screen of the PC 23. The oscilloscope 43 is electrically connected both to the frequency analyzer 42 and the PC 23, as well as to the electric probe 25, to detect the current being outputted by the power amplifier 22.

The frequency analyzer 42 analyzes the frequency component of the acoustic field based on the voltage signal by the hydrophone 31 that had been entered by the pre-amplifier 41, so as to sort such frequency component into the basic-frequency component, the harmonic components, the sub-harmonic component, and the white-noise component. Of the embodiment of this invention, the electricity-measuring instrument i.e. the spectrum analyzer is used as the frequency analyzer 42 that causes to display on the PC 23 screen a two-dimensional graph showing the frequency as the horizontal axis and the voltage as the vertical axis. It is also possible to use the frequency analyzer 42, which performs Fourier transformation, to digitalize the voltage signal by the fast Fourier transformation (FFT) circuit and then to sort such digitalized voltage signal into each frequency component.

The PC 23, which is the above-mentioned means of control as well as the arithmetic device, analyzes the frequency component obtained by the frequency analyzer 42 by entering such output signal from the frequency analyzer 42 to perform specific arithmetic operations based on such analysis.

Figure 3:
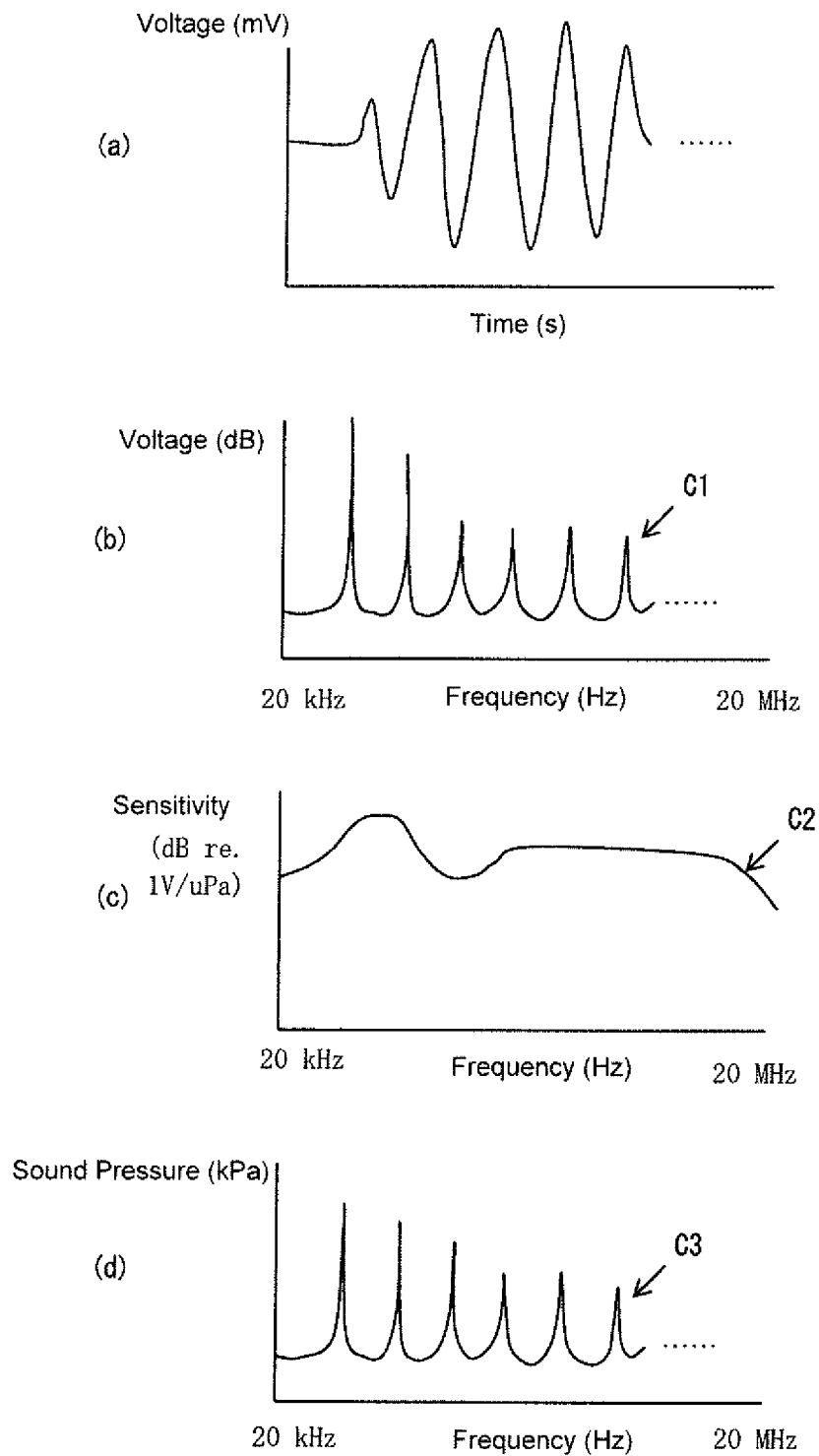
FIG. 3 shows graphs (a) to (d) explaining the adjustments of the hydrophone.

FIG. 3(a) is the graph showing the example of the voltage waveform obtained by the oscilloscope 43 through the hydrophone 31 and the pre-amplifier 41; thereof such graph the vertical axis is the voltage and the horizontal axis is the time. FIG. 3(b) is the graph showing each frequency component obtained by the frequency analyzer 42; thereof such graph the vertical axis is the voltage and the horizontal axis is the frequency. The hydrophone 31 preferably has a flat-sensitive property. In the case that the hydrophone 31 is used as shown in FIG. 3(b), e.g. the frequency component graph C2, the sensitivity of each frequency may not be flat. FIG. 3(c) shows the hydrophone sensitive-property curve C2 as compared to the standard hydrophone having well-known sensitivity; thereof such graph, the vertical axis is the sensitivity and the horizontal axis is the frequency. As shown above, in the case that the sensitivity may not be flat, the frequency-component graph C1 as shown in FIG. 3(b) shall be corrected in consideration of the hydrophone sensitive-property curve C2. As shown examply in the hydrophone sensitivity-property curve C2, it is obvious that sensitivity around 20 kHz is high, and that such sensitivity-property is not flat. FIG. 3(d) is the frequency-component graph C3 that has been corrected in consideration of the hydrophone sensitivity-property curve C2, in other words the graph that has been converted into the sound pressure (kPa) as corrected above. As such, this graph shows the kPa value corresponding to the voltage obtained by each frequency. With this example, the above correction makes the peak about 20 kHz small, thus making the sensitivity-property of the hydrophone 31 comparatively flat (see FIG. 3(d). Such a correction in sensitivity is executed by the CPU of the PC 23 that reads out e.g. the sensitivity-correction program stored in the memory of the PC 23. As for such a correction in sensitivity, the hydrophone sensitivity-property-curve data stored in the memory can be seen.

The hydrophone 31, as shown in FIG. 2, comprises the acoustic-backing material 37, designed to be acoustically flat in the frequency-sensitivity property in advance, so as to output the sound pressure that has been converted from the voltage signal by the hydrophone sensitive-property curve C2. Also, the hydrophone 31 as the embodiment applying the structure as shown in FIG. 2 has practical sensitivity within a considerably wide range of frequency between 20 kHz and 20 MHz. Here, practical sensitivity is defined as sensitivity being twice more than that of the S/N ratio.

Next, the arithmetic operation performed by the PC 23 as the arithmetic device is described. The following each arithmetic operation is conducted by the CPU based on the specific program stored in the memory of the PC 23.

Firstly, the PC 23 receives from the frequency analyzer 42 the analysis (i.e. corrected frequency-component graph C3) of the frequency component. Then, based on such analysis, the PC 23 conducts arithmetic operations to evaluate the average of broadband sound pressure (ABP: Average of Broadband Sound Pressure) of the white-noise component 51 within the frequency range having practical sensitivity and having the average of sound pressure (AP: Average of Sound Pressure) of the frequency component within the entire frequency range of practical sensitivity. Of the hydrophone 31 as the embodiment of this invention, "the frequency range having the practical sensitivity" means the frequency of between 20 kHz and 20 MHz.

The ABP value and the AP value are evaluated by the following Formula 2 and Formula 3.

$$AP = \frac{\int_{f_a}^{f_b}(P_A - P_N)df}{f_b - f_a} \quad \text{Formula 2}$$

$$ABP = \frac{\int_{f_0}^{f_b}(P_W - P_N)df}{f_b - f_a} \quad \text{Formula 3}$$

As for the above formulas 2 and 3, $P_N$ is the background-noise component of the sound pressure within the frequency range of $f_a$ (=20 kHz) to $f_b$ (=20 MHz), which is obtained by the hydrophone 31. $P_A$ is the entire sound-pressure component within the frequency range of $f_a$ to $f_b$. Pw is the value of which the basic-frequency component within the frequency range of $f_a$ to $f_b$ of the entire harmonic component and of the sound pressure of the entire harmonic component are deducted from $P_A$. In other words, AP is the value of which the ($P_A$-$P_N$) is integrated by the range of $f_a$ to $f_b$ and then divided by ($f_b$-$f_a$), thus showing the average sound pressure of the entire frequency component within the applicable range. ABP is the value of which the ($P_W$-$P_N$) is integrated by the range of $f_a$ to $f_b$ and then divided by ($f_b$-$f_a$), thus showing the average sound pressure of the white noise 51 within the applicable range.

Figure 4:
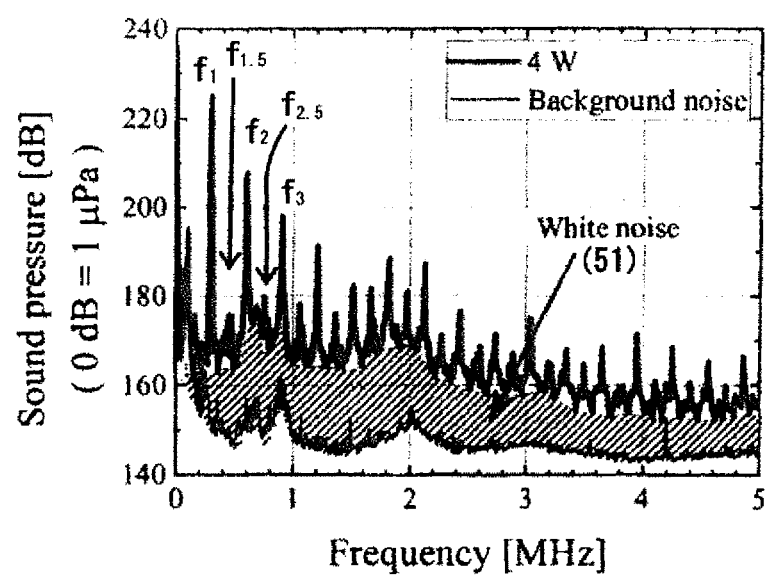
FIG. 4 is the graph showing the relationship between the frequency and the hydrophone.

FIG. 4 is the graph showing the frequency component of the sound pressure of the acoustic field being generated within the processing tank 12 by the irradiating ultrasonic waves at the frequency of 300 kHz and by the applied electric power of 4 W. As for this graph, the vertical axis is the sound pressure, and the horizontal axis is the frequency component. This graph shows also the basic-frequency component $f_1$ as the greatest peak of the sound pressure and shows the peaks of the harmonic components $f_2$, $f_3$ and the peaks of the sub-harmonic components $f_{1.5}$, $f_{2.5}$, as well as showing the white-noise component 51.

Figure 5:
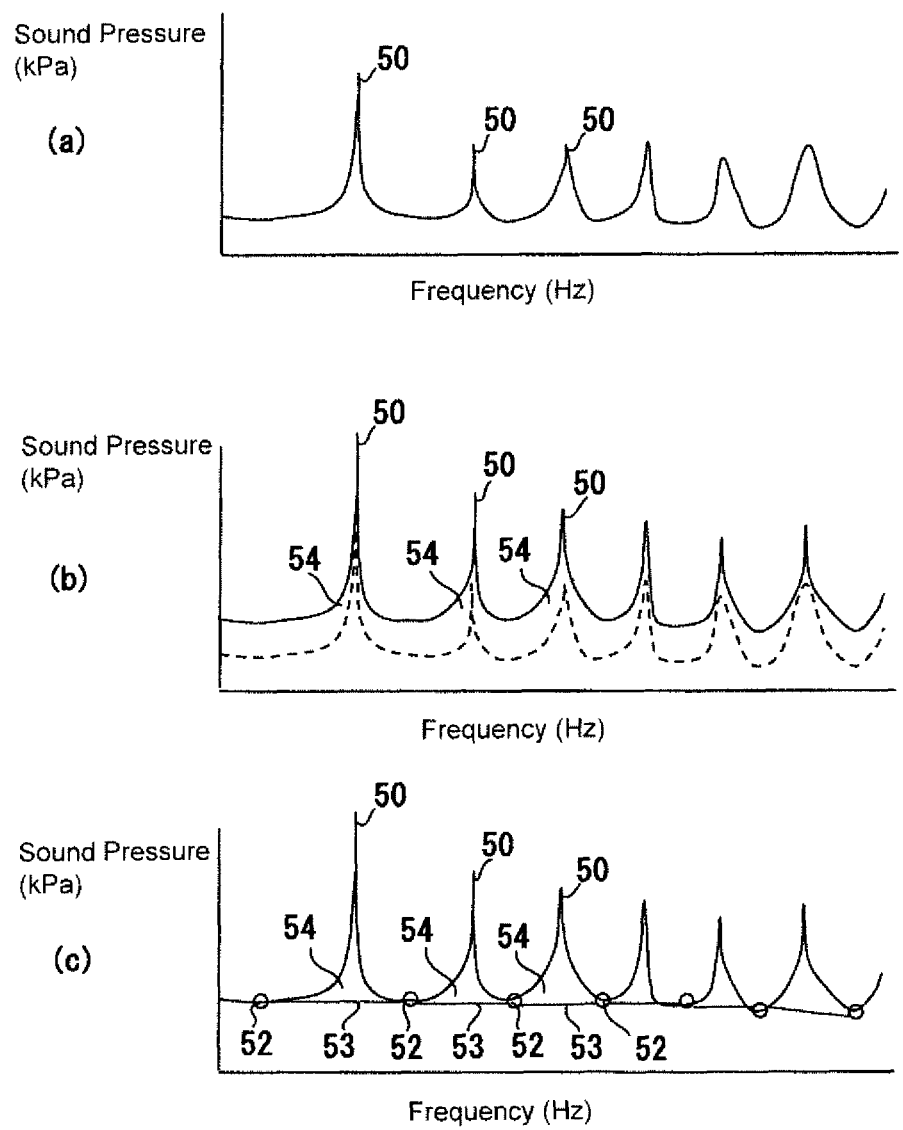
FIG. 5 shows graphs (a) to (c) explaining the extraction of the white-noise component.

Hereinafter, the extraction of the white-noise component 51 is described based on FIG. 5(a) to FIG. 5(c). FIG. 5(a) is the graph showing the frequency component at the time of the low-sound pressure at which time the peak 50 of each frequency is low. FIG. 5(b) is the graph showing the frequency component at the time of the high intensity at which time the peak 50 of each frequency component is higher than it was in the previous case. Accordingly, the lower-spreading area 54 is seen expanding. Then, extracting the white-noise component 51 should be done by the following procedures. Firstly, extract the peaks 50 of the frequency components regarding the sound pressure within the frequency range having practical sensitivity, and then extract the valleys 52 between such adjoining peaks 50 (see FIG. 5(c). Secondly, connect each extracted valley 52 that are in a line (straight line) and remove the upper areas (i.e. each peak 50 and the lower-spreading areas) beyond the line 53. Then, subtract the background noise without using the ultrasonic impression of each frequency. As such, the white-noise component 51 can be extracted. In the embodiment of this invention, the program for extracting the white-noise component is stored in the CPU memory. Executing this program by the CPU automatically extracts the white-noise component 51.

The PC 23 of the ultrasonic cleaner 11 presumes the cavitation threshold TH1 whereat the ABP increases from about zero and at the same time presumes the amount of cavitation being generated based on the level of the ABP value. Furthermore, the PC 23 presumes the accurate value of the sound pressure based on the AP value, as well as presumes, based on the ABP value, the threshold whereat metallic erosion starts by the ultrasonically mechanical effect.

Figure 6:
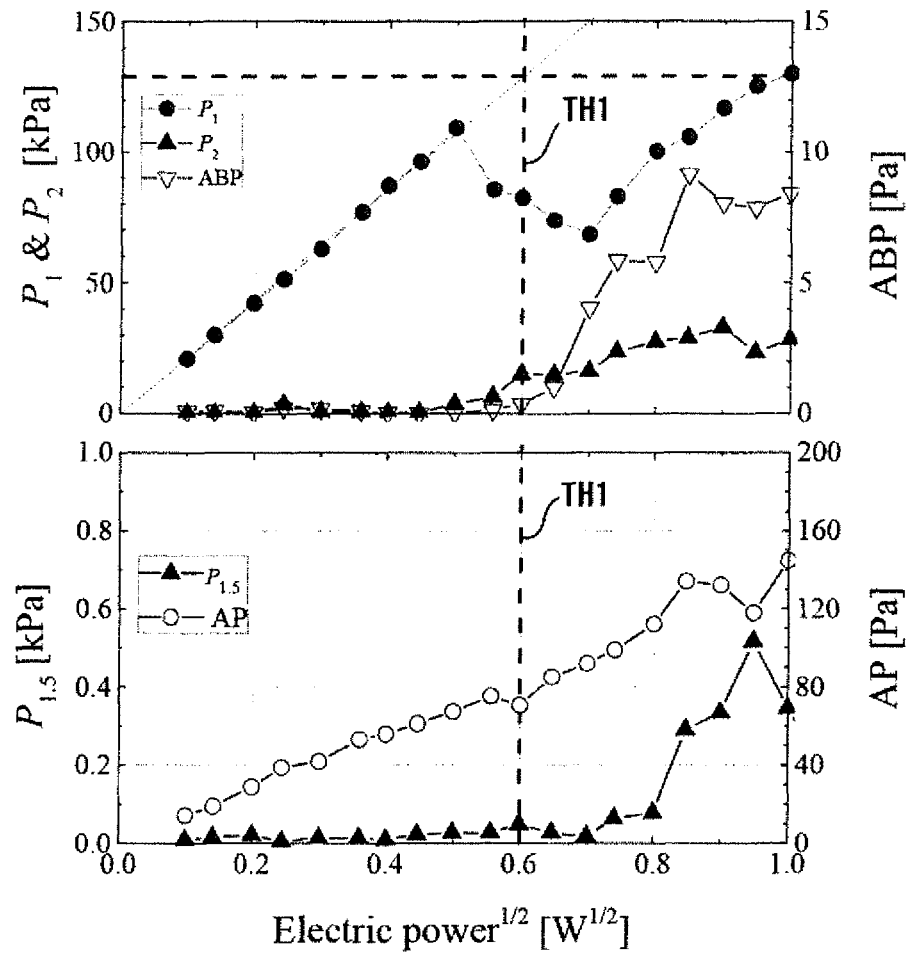
FIG. 6 shows the graphs explaining the relationship between the applied voltage and the sound pressure of the hydrophone at the time of applying low voltage.

FIG. 6 is the graph showing the relationship between the one-half power of the electric power being applied to the ultrasonic transducer 13, as said ultrasonic transducer 13 is applying the low voltage, and showing the sound pressure $P_1$ of the basic-frequency component $f_1$ and the sound pressure $P_2$ of the harmonic component $f_2$ and the sound pressure $P_{1.5}$ of the sub-harmonic component $f_{1.5}$ and showing the AP value and the ABP value. The vertically extending broken line of the graph shows the cavitation threshold TH1 that indicates that there is such a cavitation threshold TH1 whereat the one-half power of the applied electric power becomes 0.6 $W^{1/2}$.

In the case that the applied electric power is gradually increased from zero, the APB value remains about zero until it becomes 0.6 $W^{1/2}$. The APB value increases from about zero whereat the applied voltage exceeds about 0.6 $W^{1/2}$. After that, it begins increasing moderately. Therefore, it is suggested that the cavitation threshold TH1 is at this such point.

Focusing on the sound pressure $P_1$ of the basic-frequency component $f_1$, it is recognized that the behavior of this sound pressure $P_1$ begins to decrease at a point over 0.56 $W^{1/2}$, which is less than the cavitation threshold TH1 and which increases again at a point over 0.74 $W^{1/2}$, which is higher than the cavitation threshold TH1, thus concluding that it is inappropriate to presume accurately the cavitation threshold TH1 in reference to the sound pressure P1 that does not linearly correspond to the applied voltage.

Figure 7:
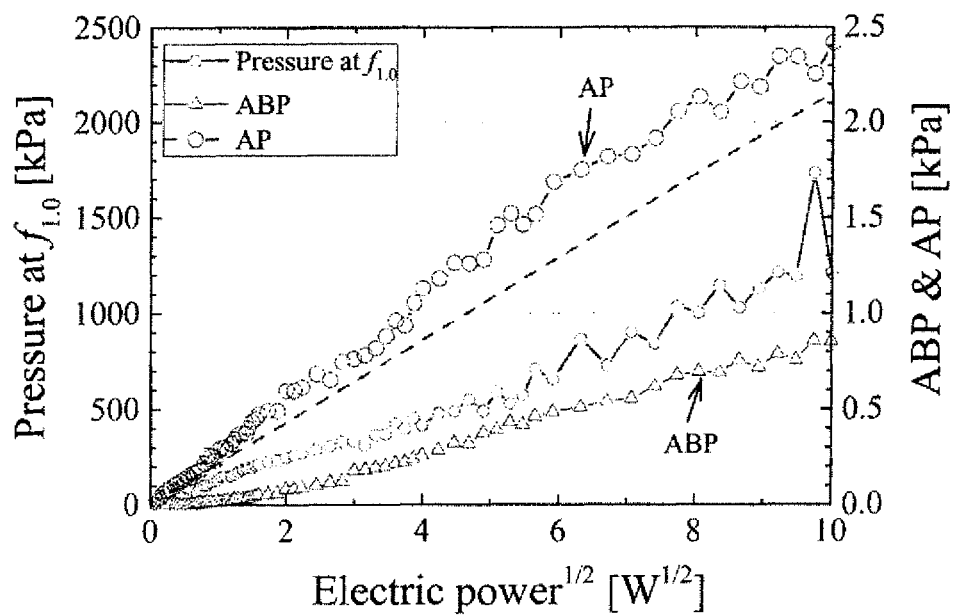
FIG. 7 is the graph explaining the relationship between the applied voltage and the sound pressure of the hydrophone at the time of applying high voltage.

Contrarily, it is recognized that the AP value comparatively increases in a linear fashion, even if it exceeds 0.56 $W^{1/2}$. As seen in the graph of FIG. 7 showing the relationship between the applied voltage in applying the high voltage and the sound pressure of the hydrophone 31, the AP value comparatively increases in a linear fashion until it becomes 10 $W^{1/2}$. Thus, the AP value almost linearly corresponds to the applied voltage. Also, the APB value almost linearly corresponds as well to the applied voltage at a point over 0.6 $W^{1/2}$, thus concluding that it is appropriate to presume that the accurate sound-pressure value is based on the AP value, and that the amount of cavitation being generated is based on the APB value.

Focusing on the sound pressure $P_2$ of the harmonic component $f_2$, it is recognized that the sound pressure $P_2$ increases at the time of the applied electric power being slightly lower than the cavitation threshold TH1. Thus, it is thought that there is a non-linear oscillation induced by air bubbles even by the lower sound pressure than the cavitation threshold TH1. Focusing on the sound pressure $P_{1.5}$ of the sub-harmonic component $f_{1.5}$, it is recognized that instead the sound pressure $P_{1.5}$ increases at a point over 0.74 $W^{1/2}$, thus exceeding the cavitation threshold TH1. For all the reasons stated above, it is thought that the white-noise component 51, the sub-harmonic component $f_{1.5}$ and the harmonic component $f_2$ appear in the vicinity of the cavitation threshold TH1, and that the sound pressure $P_1$ of the basic-frequency component $f_1$ decreases. Of course, it is concluded that it is impossible to presume accurately the cavitation threshold TH1, even with reference to the sound pressure $P_2$ of the harmonic component $f_2$ or the sound pressure $P_{1.5}$ of the sub-harmonic component $f_{1.5}$. However, as described above, introducing the ABP value makes it possible to presume accurately the cavitation threshold TH1.

Figure 8:
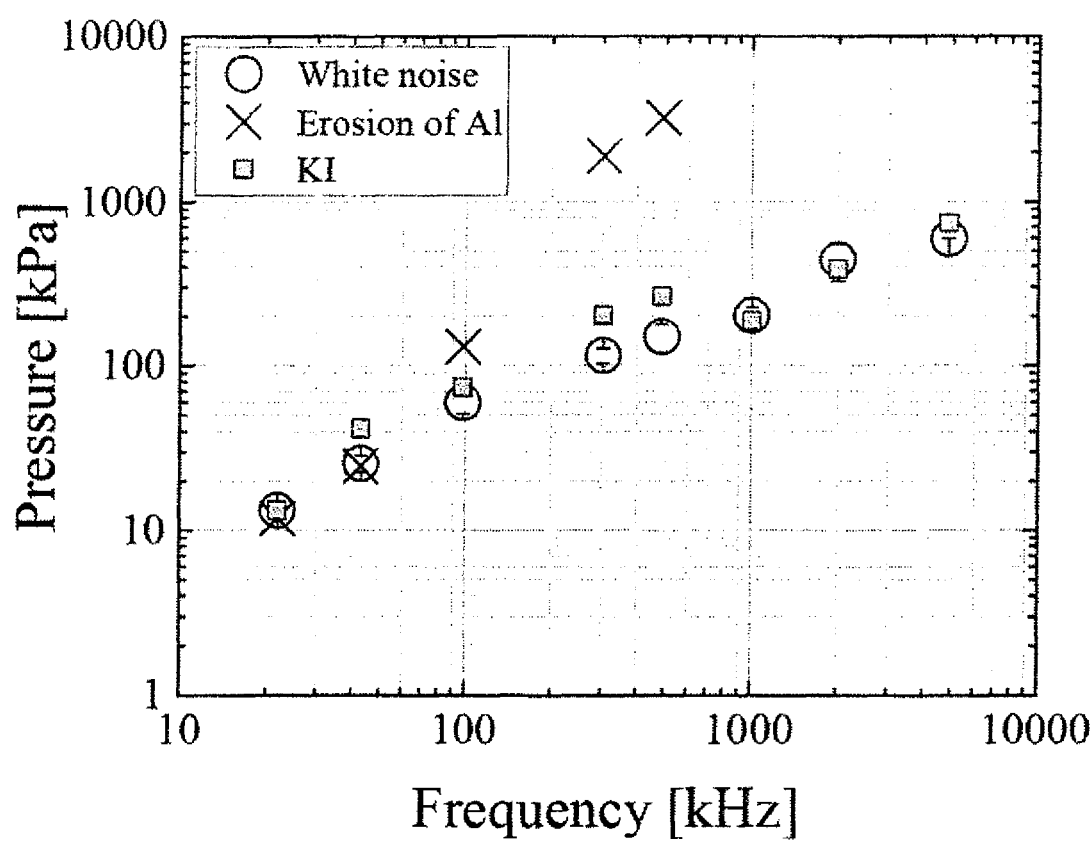
FIG. 8 is the graph showing the cavitation threshold of each frequency, the threshold whereat ultrasonically chemical effect starts, and the threshold whereat metallic erosion starts by ultrasonically mechanical effect.

FIG. 8 is the graph showing the cavitation threshold TH1 of each frequency. Here, the ABP value of the white-noise component 51 is to be the cavitation threshold TH1. Said graph also shows the threshold per frequency whereat erosion starts on the aluminum foil due to ultrasonically mechanical effect (i.e. metallic erosion threshold) and shows the threshold per frequency whereat $I_3$ generates due to chemical effect by the KI method (i.e. the threshold whereat ultrasonically chemical effect (sonochemical reaction) is developed. This graph also shows that the threshold whereat chemical effect is induced by the KI method is almost identical to the cavitation threshold TH1 of each frequency. Therefore, it is recognized that ultrasonically chemical effect is induced at the same time as the start of cavitation. It is also recognized that the above metallic-erosion threshold is almost identical to the cavitation threshold TH1 at 22 kHz and 43 kHz, and that the metallic-erosion threshold is greater than the cavitation threshold TH1 within the high-frequency range of 100 kHz or more.

For all the reasons stated above, it is recognized that the ABP value makes it possible to presume accurately both the metallic-erosion threshold and the threshold whereat ultrasonically chemical effect starts. It is also recognized that the ABP value makes it possible to presume accurately both such thresholds as well as whereat ultrasonically chemical effect starts even within the high-frequency range of 100 kHz or more. It is impossible to presume directly and accurately the metallic-erosion threshold, since such threshold is greater than the cavitation threshold TH1 within the high-frequency range of 100 kHz or more. However, it is concluded that the metallic-erosion threshold can be presumed to a certain degree of accuracy as being slightly greater than the cavitation threshold based on the ABP value.

Next, the cleaning process of the cleaning target using the ultrasonic cleaner 11 of the structure as described above is explained.

The operator places the cleaning target into the liquid W1 being stored within the processing tank 12 of the ultrasonic cleaner 11 and then turns on the switch (not shown in the drawing) to start the cleaning. The PC 23, as the drive unit, activates the ultrasonic oscillator 21 by such switching operation. At this time, the ultrasonic oscillator 21 transfers the oscillating signal of e.g. 300 kHz through the power amplifier 22 to generate the specific ultrasonic waves by the ultrasonic transducer 13. Such ultrasonic waves generated by the ultrasonic transducer 13 are then propagated into the liquid W1 being stored within the processing tank 12, thus forming therein the acoustic field to work on the cleaning target, thus removing the dirt on the surface of such cleaning target.

At this time, the hydrophone 31 detects the ultrasonic acoustic field being generated into the liquid W1 and transfers the voltage signal, which corresponds to the sound pressure, to the frequency analyzer 42 through the preamplifier 41. The frequency analyzer 42 then analyzes the frequency component of the acoustic field, based on the voltage signal entered, and then outputs the analysis to the PC 23 as the arithmetic device. The PC 23 then performs arithmetic operations, based on the analysis of the frequency component obtained by the frequency analyzer 42, to evaluate the AP value and the APB value, thus presuming, based on all the values, the cavitation threshold TH1 at the current frequency as well as the metallic-erosion threshold and the threshold whereat ultrasonically chemical effect starts.

For example, in the case that the cleaning target should be cleaned under the condition of a comparatively lower sound pressure, the PC 23 sets the applied voltage under the condition of such sound pressure, so as not to exceed the threshold whereat ultrasonically chemical effect starts due to the generation of cavitation, thus controlling the drive of the ultrasonic transducer 13. Also, in the case that the cleaning target should be cleaned under the condition of a comparatively higher sound pressure, the PC 23 sets the applied voltage under such condition of such sound pressure between the threshold whereat ultrasonically chemical effect starts and whereat metallic erosion starts due to said ultrasonically mechanical effect, thus controlling the drive of the ultrasonic transducer 13.

As such, the ultrasonic cleaner 11 as the embodiment of this invention conducts the ultrasonic cleaning by adjusting the ultrasonic output according to the status of the cavitation being generated. Then, the operator operates the stop-cleaning button (not shown in the drawing) after a specific period of time, so that the PC 23 stops the ultrasonic oscillator 21, thus completing the ultrasonic-cleaning process.

Therefore, the embodiment of this invention realizes the following effects.

(1) The ultrasonic cleaner 11 as the embodiment of this invention, in introducing the above-mentioned APB value, allows for presuming accurately the cavitation threshold and the amount of cavitation being generated compared to other methods. It is also possible to presume the correct sound pressure based on the AP value introduced. For all the reasons stated above, it is possible to set readily and surely the ultrasonic processing conditions appropriate for the ultrasonic cleaning based on such correct presumptions.

(2) The ultrasonic cleaner 11 as the embodiment of this invention controls the drive of the ultrasonic transducer by selecting either the sound-pressure condition that does not exceed the threshold whereat ultrasonically chemical effect starts due to the generation of cavitation or the sound-pressure condition between the threshold whereat ultrasonically chemical effect starts and whereat metallic erosion starts due to such ultrasonically mechanical effect. Thus, in the case that the former condition above is selected, it is possible to clean the target by setting the condition just before such chemical effect starts, which makes it possible to avoid causing physical damage to the surface of the cleaning target due to unnecessary improvement in the cleaning capability. Also, in selecting the latter condition, it is possible to clean the target by setting such condition just before the metallic erosion starts while the chemical effect is starting, which makes it possible to avoid causing physical damage to the surface of the cleaning target due to unnecessary improvement in the cleaning capability. As such, the embodiment of this invention allows for selecting either a sound-pressure condition that is comparatively lower or one that is comparatively higher, thus making it possible to conduct the appropriate cleaning process according to the property of the cleaning target or the like.

(3) Of the ultrasonic cleaner 11 as the embodiment of this invention, the PC 23, regarding the sound pressure within the range of frequency of practical sensitivity, connects the valleys 52 among the adjoining frequency peaks 50 in the line 53 and removes the upper areas other than the line, thus performing the arithmetic operation to extract the white-noise component 51. Such arithmetic operation totally removes the basic-frequency component, the harmonic component and the sub-harmonic component appearing at a higher sound pressure than the white-noise component 51, so as to improve the reliability of the integral-computation by the above Formula 3, thus making it possible to extract accurately the white-noise component 51. As a result, it is possible to presume accurately and readily the cavitation threshold TH1 and the amount of cavitation being generated.

(4) The hydrophone 31 as the embodiment of this invention has practical sensitivity at a frequency of 20 kHz and more to 20 MHz or less. In other words, the arithmetic operations are performed by using the voltage signal being transferred from the hydrophone 31 having practical sensitivity ranging widely from a low frequency to a high frequency, thus making it possible to evaluate more accurately the ABP value and the AP value. Therefore, it is possible to presume extremely accurately the cavitation threshold and the amount of cavitation being generated.

(5) The hydrophone 31 as the embodiment of this invention has a structure of which the front side of the piezoelectric body 35 is joined to the inner side of the anti-erosion metal case 32 and another structure of which the acoustic-backing material 37 is aligned on the back side of the piezoelectric body 35, thus preventing such piezoelectric body 35 from being exposed directly to the outside and preventing such piezoelectric body from being affected by strong vibration or impact. Also, aligning the acoustic-backing material 37 makes it possible to design the frequency-sensitivity property to be acoustically flat, so as to have practical sensitivity within a wide frequency range. Therefore, it is possible that the hydrophone 31 be heavy-duty and highly sensitive, though it is small in size. Using such a hydrophone 31 makes it easier to achieve a small-sized, low-priced, durable and high-precision sound-pressure analyzer 14.

Each embodiment below of this invention can be modified.

As described in the above embodiment, the hydrophone 31 is soaked in the liquid W1 at the upper opening of the processing tank 12. However, it is possible to use another type of hydrophone, one that is provided along either side wall of the processing tank 12 or on the bottom-diaphragm plate or the like.

As described in the above embodiment, the hydrophone 31 consists of the titanium anti-erosion metal case 32. However, it is not limited to that. It is possible that the case 32 be made of another type of anti-erosion metal (e.g. stainless steel or the like) other than titanium. Also, it is possible that the case 32 be made of a material other than metal (e.g. of a glass material such as quarts or the like).

Of the above embodiment of this invention, the sound-pressure analyzer and the method of its use in the high-intensity acoustic field are embodied in the ultrasonic cleaner 11. However, they can also be embodied in an ultrasonic disperser or in an ultrasonic sterilizer or in an ultrasonic reactor by using sonochemical reaction or the like. Also, the sound-pressure analyzer in the high-intensity acoustic field of this invention can also be an ultrasonic-cavitation meter that detects whether cavitation is being generated or not, and, if so being generated, measures the amount of such cavitation being generated.

DESCRIPTION OF THE REFERENCE NUMERALS

11: Ultrasonic cleaner
12: Processing tank
13: Ultrasonic transducer
14: Sound-pressure analyzer in the high-intensity acoustic field
21: Ultrasonic oscillator making up the drive unit
22: Power amplifier making up the drive unit
23: Computer making up a part of the drive unit as well as the arithmetic device
31: Hydrophone
32: Anti-erosion metal case
35: Piezoelectric body
37: Acoustic-backing material
42: Frequency analyzer
50: Peak
51: White-noise component
52: Valley
53: Line segment
54: Lower-spreading area
ABP: Average of broadband sound pressure of the white-noise component within the ultrasonic range having practical sensitivity
AP: Average of sound pressure of the entire frequency component within the ultrasonic range having practical sensitivity
$f_1$: Basic-frequency component
$f_2$, $f_3$: Harmonic component
$f_{1.5}$, $f_{2.5}$: Sub-harmonic component
TH1: Threshold whereat cavitation generates (Cavitation threshold)
W1: Liquid The following disclosures were made by the inventor or joint inventor 1 year or less before the effective filing date of the claimed invention.

1. Tam Thanh Nguyen et al., "Measurement and frequency dependence of thresholds for cavitation, chemical effect, and mechanical effect", The 25$^{th}$ Sonochemistry Panel Discussion: Compilation of lectures, page 26, Oct. 21, 2016.
2. Yoshiyuki Asakura et al., "Measurement of Distribution of Sound Pressure of Fundamental, Subharmonic and White Noise in Sonochemical Reactor", Proceedings of Symposium on Ultrasonic Electronics, vol. 37, Nov. 16, 2016.
3. Tam Thanh Nguyen et al., "Measurement of Sound Pressure in the Presence of Cavitation Bubbles", Proceedings of Symposium on Ultrasonic Electronics, vol. 37, Nov. 16, 2016.

The invention claimed is:

1. A sound-pressure analyzer in the high-intensity acoustic field, comprising: a hydrophone for detecting an ultrasonic acoustic field in a liquid and for outputting a voltage signal corresponding to such an acoustic field; a frequency analyzer for analyzing the frequency component of such an acoustic field based on the voltage signal being outputted from said hydrophone and for sorting such a frequency component into a basic-frequency component, a harmonic component, a sub-harmonic component and a white-noise component; and an arithmetic device for performing specific arithmetic operations based on an analysis of the frequency component obtained by the frequency analyzer, characterized in that the arithmetic device evaluates the average of broadband sound pressure (ABP) of the white-noise component within a frequency range of practical sensitivity by performing arithmetic operations and by presuming that there is a threshold whereat cavitation starts at a point whereat the average of broadband sound pressure (ABP) of the white-noise component increases from about zero, and that the amount of cavitation being generated is presumed according to the level of the average of broadband sound pressure (ABP) of the white-noise component.

2. A sound-pressure analyzer in the high-intensity acoustic field according to claim 1, characterized in that the arithmetic device connects the valleys among the plurally adjoining frequency peaks in a line, concerning the sound pressure within a frequency range having practical sensitivity, so as to remove the upper area other than the line, thus extracting the white-noise component.

3. A sound-pressure analyzer in the high-intensity acoustic field according to claim 1, characterized in that the arithmetic device by the arithmetic operation evaluates the average of sound pressure (AP) of all the frequency components within a frequency range having practical sensitivity, thus presuming the correct sound-pressure value based on the average of sound pressure (AP) of all the frequency components.

4. A sound-pressure analyzer in the high-intensity acoustic field according to claim 1, characterized in that the threshold whereat metallic erosion starts by ultrasonically mechanical effect is evaluated based on the average of broadband sound pressure (ABP) of the white-noise component.

5. A sound-pressure analyzer in the high-intensity acoustic field according to claim 1, characterized in that the hydrophone converts the voltage signal into sound pressure according to the hydrophone-sensitivity characteristic curve, and then such sound pressure is outputted.

6. A sound-pressure analyzer in the high-intensity acoustic field according to claim 1, characterized in that the hydrophone has practical sensitivity as well as a sensitivity that is defined as being more than twice the sensitivity of the S/N ratio (signal-to-noise ratio), and also that such sensitivity is of a frequency exceeding 5 MHz.

7. A sound-pressure analyzer in the high-intensity acoustic field according to claim 1, characterized in that the hydrophone has practical sensitivity defined as sensitivity being more than twice the sensitivity of the S/N ratio and ranging from 20 kHz or more and to 20 MHz or less.

8. A sound-pressure analyzer in the high-intensity acoustic field according to claim 1, characterized in that the hydrophone has a structure of which the front side of a piezoelectric body is joined to the inner side of an anti-erosion metal case and of which an acoustic-backing material is aligned on the back side of such piezoelectric body.

9. A sound-pressure analyzer in the high-intensity acoustic field according to claim 1, characterized in that the sound-pressure analyzer is an ultrasonic-cavitation meter.

10. An ultrasonic cleaner for cleaning a cleaning target being soaked in a liquid by using ultrasonic waves comprising: a processing tank for preserving such a liquid; an ultrasonic transducer, provided on the processing tank, for irradiating such ultrasonic waves into the liquid within the processing tank; a drive unit for controlling the drive of such an ultrasonic transducer; and a sound-pressure analyzer in the high-intensity acoustic field according to claim 1.

11. An ultrasonic cleaner according to claim 10, characterized in that the drive unit, based on analysis by the sound-pressure analyzer, controls the drive of the ultrasonic transducer on the sound-pressure condition that does not exceed the threshold whereat ultrasonically chemical effect starts with the generation of cavitation.

12. An ultrasonic cleaner according to claim 10, characterized in that the drive unit, based on analysis by the sound-pressure analyzer, selects either a sound-pressure condition that does not exceed the threshold whereat the ultrasonically chemical effect starts with the generation of cavitation or a sound-pressure condition between the threshold whereat the ultrasonically chemical effect starts and the threshold whereat metallic erosion starts with the ultrasonically mechanical effect, thus controlling the drive of the ultrasonic transducer.

13. An ultrasonic processor for chemically processing the cleaning target being soaked in a liquid by using ultrasonic waves, characterized in comprising: a processing tank for reserving such liquid; an ultrasonic transducer provided within such processing tank for irradiating such ultrasonic waves into said liquid within said processing tank; a drive unit for controlling the drive of the ultrasonic transducer; and a sound-pressure analyzer in the high-intensity acoustic field according to claim 1.

14. An ultrasonic processor, according to claim 10, characterized in that the drive unit, based on analysis by the sound-pressure analyzer, controls the drive of the ultrasonic transducer under a sound-pressure condition that does not exceed the threshold whereat ultrasonically chemical effect starts with the generation of cavitation.

15. A method for analyzing the sound pressure in a high-intensity acoustic field, which method comprises: an acoustic field-detecting step for detecting an ultrasonic acoustic field in a liquid by using a hydrophone that outputs a voltage signal corresponding to the sound pressure in such an acoustic field; a frequency-analyzing step for analyzing the frequency component in such an acoustic field based on a voltage signal being outputted by such a hydrophone and then sorting such frequency component into a basic-frequency component, a harmonic component, a sub-harmonic component and a white-noise component; and an arithmetic step for performing specific arithmetic operations based on analysis of the frequency obtained by the frequency analyzer, characterized in that the arithmetic step performs such arithmetic operations for evaluating the average of broadband sound pressure (ABP) of the white-noise component within a frequency range having practical sensitivity, presuming that there is a threshold of cavitation being generated at the point whereat the average of broadband sound pressure (ABP) of the white-noise component increases from about zero, and presuming that the amount of cavitation being generated is at the level of the average of broadband sound pressure (ABP) of the white-noise component.

16. A method for analyzing the sound pressure in the high-intensity acoustic field according to claim 15, characterized in that the arithmetic step performs arithmetic operations to evaluate the average of sound pressure (AP) of the entire frequency component within the range of frequency having practical sensitivity, thus presuming accurately the sound-pressure value based on the average of sound pressure (AP) of the entire frequency component.

17. A method for analyzing the sound pressure in the high-intensity acoustic field according to claim 15, characterized in that the threshold whereat metallic erosion starts by ultrasonically mechanical effect is presumed by the arithmetic step based on the average of broadband sound pressure (ABP) of the white-noise component.

* * * * *